(12) United States Patent
Li et al.

(10) Patent No.: US 10,937,355 B2
(45) Date of Patent: Mar. 2, 2021

(54) DISPLAY SUBSTRATE WITH PHOTOELECTRIC SENSOR HAVING REGIONS CONNECTED WITH EACH OTHER, DISPLAY PANEL AND DISPLAY DEVICE

(71) Applicant: BOE TECHNOLOGY GROUP CO., LTD., Beijing (CN)

(72) Inventors: Dongsheng Li, Beijing (CN); Jianming Sun, Beijing (CN); Huili Wu, Beijing (CN); Shipei Li, Beijing (CN); Qingrong Ren, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/872,412

(22) Filed: May 12, 2020

(65) Prior Publication Data
US 2020/0273393 A1    Aug. 27, 2020

Related U.S. Application Data

(62) Division of application No. 15/977,015, filed on May 11, 2018, now abandoned.

(30) Foreign Application Priority Data

Aug. 1, 2017    (CN) .......................... 201710648337.7

(51) Int. Cl.
*G09G 3/20*    (2006.01)
*G06K 9/00*    (2006.01)
(Continued)

(52) U.S. Cl.
CPC ......... *G09G 3/2003* (2013.01); *G06K 9/0004* (2013.01); *G06K 9/209* (2013.01);
(Continued)

(58) Field of Classification Search
CPC ............ H01L 51/5271; H01L 27/3227; H01L 27/3218; H01L 25/167; G06K 9/0004;
(Continued)

(56) References Cited

U.S. PATENT DOCUMENTS 9,117,711 B2 * 8/2015 Suzuki ............... H04N 9/04555
2009/0102768 A1    4/2009 Shimizu
(Continued)

FOREIGN PATENT DOCUMENTS

CN    102830536 A    12/2012
CN    103378126 A    10/2013
(Continued)

OTHER PUBLICATIONS

First Office Action for Chinese Patent Application No. 201710648337.7 dated Jun. 26, 2019.

*Primary Examiner* — Kwang-Su Yang
(74) *Attorney, Agent, or Firm* — Calfee, Halter & Griswold LLP

(57) ABSTRACT

A display substrate, a display panel, and a display device. The display substrate includes a substrate, and a plurality of polygonal pixels arranged in an array on the substrate. Each polygonal pixel includes a plurality of sub-pixels and a photoelectric sensor. An orthographic projection of the plurality of sub-pixels on the substrate and an orthogonal projection of the photoelectric sensor on the substrate do not overlap with each other. The display substrate, the display panel and the display device of the embodiments of the present disclosure can maximize the collection of optical signals, thereby improving the efficiency of the photoelectric sensor and the accuracy of a fingerprint identification in certain applications.

18 Claims, 4 Drawing Sheets

(51) Int. Cl.
*H01L 25/16* (2006.01)
*H01L 51/52* (2006.01)
*H01L 27/32* (2006.01)
*G06K 9/20* (2006.01)
*G09G 3/36* (2006.01)
*G09G 3/30* (2006.01)

(52) U.S. Cl.
CPC ............ *G09G 3/20* (2013.01); *G09G 3/2074* (2013.01); *H01L 25/167* (2013.01); *H01L 27/3218* (2013.01); *H01L 27/3227* (2013.01); *H01L 51/5271* (2013.01); *G09G 3/30* (2013.01); *G09G 3/36* (2013.01); *G09G 3/3607* (2013.01); *G09G 2300/0452* (2013.01); *G09G 2360/148* (2013.01)

(58) Field of Classification Search
CPC .... G06K 9/209; G09G 3/2074; G09G 3/2003; G09G 3/20; G09G 3/30; G09G 2300/0452; G09G 3/36; G09G 2360/148; G09G 3/3607
See application file for complete search history.

(56) References Cited

U.S. PATENT DOCUMENTS

| | | | |
|---|---|---|---|
| 2012/0092302 A1* | 4/2012 | Imai | G06F 3/0412 345/175 |
| 2013/0176283 A1 | 7/2013 | Nakata | |
| 2013/0277645 A1 | 10/2013 | Antonenkov | |
| 2017/0220839 A1 | 8/2017 | Yang et al. | |
| 2017/0221972 A1 | 8/2017 | Yang et al. | |
| 2018/0015112 A1 | 5/2018 | Ding et al. | |
| 2018/0240851 A1 | 8/2018 | Liu | |

FOREIGN PATENT DOCUMENTS

| | | |
|---|---|---|
| CN | 105047689 A | 11/2015 |
| CN | 105095877 A | 11/2015 |
| CN | 106598327 A | 4/2017 |
| KR | 20160056389 A | 5/2016 |

* cited by examiner

DISPLAY SUBSTRATE WITH PHOTOELECTRIC SENSOR HAVING REGIONS CONNECTED WITH EACH OTHER, DISPLAY PANEL AND DISPLAY DEVICE

RELATED APPLICATIONS

This application is a divisional application of U.S. Ser. No. 15/977,015, filed on May 11, 2018 which claims the benefit of Chinese Patent Application No. 201710648337.7, filed on Aug. 1, 2017, the entire disclosures of which are incorporated herein by reference.

TECHNICAL FIELD

The present disclosure relates to the field of display technology, in particular to a display substrate, a display panel and a display device.

BACKGROUND

At present, most display screens adopt the conventional RGB arrangement, that is, a square pixel is divided into three equal parts and each part is represented by red, green and blue, thereby forming a color pixel. In embedded fingerprint identification technology, the conventional fingerprint identification key is abandoned, and fingerprint identification is performed by pressing directly on the display screen.

SUMMARY

A display substrate provided by an embodiment of the first aspect of the present disclosure includes: a substrate, and a plurality of polygonal pixels arranged in an array on the substrate. Each polygonal pixel includes a plurality of sub-pixels and a photoelectric sensor. An orthographic projection of the plurality of sub-pixels on the substrate and an orthogonal projection of the photoelectric sensor on the substrate do not overlap with each other.

In some embodiments, in each polygonal pixel, the plurality of sub-pixels are disposed on a periphery of the polygonal pixel, and an edge of each sub-pixel at a periphery of the polygonal pixel overlaps with an edge of the polygonal pixel.

In some embodiments, a shape of the sub-pixel is a triangle or an isosceles trapezoid.

In some embodiments, in each polygonal pixel, an edge of each sub-pixel near the center of the polygonal pixel has an arc shape, and an arcing direction of the arc shape departs from the center of the polygonal pixel.

In some embodiments, each polygonal pixel includes three sub-pixels of different colors, and a shape of the polygonal pixel is a hexagon.

In some embodiments, the three sub-pixels of different colors in each polygonal pixel correspond to the first edge, the third edge, and the fifth edge of the hexagon respectively.

In some embodiments, each polygonal pixel includes four sub-pixels of different colors, and a shape of the polygonal pixel is an octagon.

In some embodiments, the four sub-pixels of different colors in each polygonal pixel correspond to the first edge, the third edge, the fifth edge, and the seventh edge of the octagon respectively.

In some embodiments, the photoelectric sensor and the plurality of sub-pixels are disposed in different layers, and the plurality of sub-pixels are closer to the light exit side of the display substrate than the photoelectric sensor.

In some embodiments, the photoelectric sensor is a photodiode.

In some embodiments, the sub-pixel is a light emitting device.

A display panel provided by an embodiment of the second aspect of the present disclosure includes the display substrate as described in the above embodiments.

A display device provided by an embodiment of the third aspect of the present disclosure includes the display panel as described in the above embodiment.

Additional aspects and advantages of the present disclosure will be given in the following description, which will become apparent from the following description, or can be understood through practice of the disclosure.

BRIEF DESCRIPTION OF THE DRAWINGS

The above and/or additional aspects and advantages of the present disclosure will become apparent and easily understood from the following description of embodiments in conjunction with the drawings, in which.

DETAILED DESCRIPTION OF THE DISCLOSURE

Figure 1:
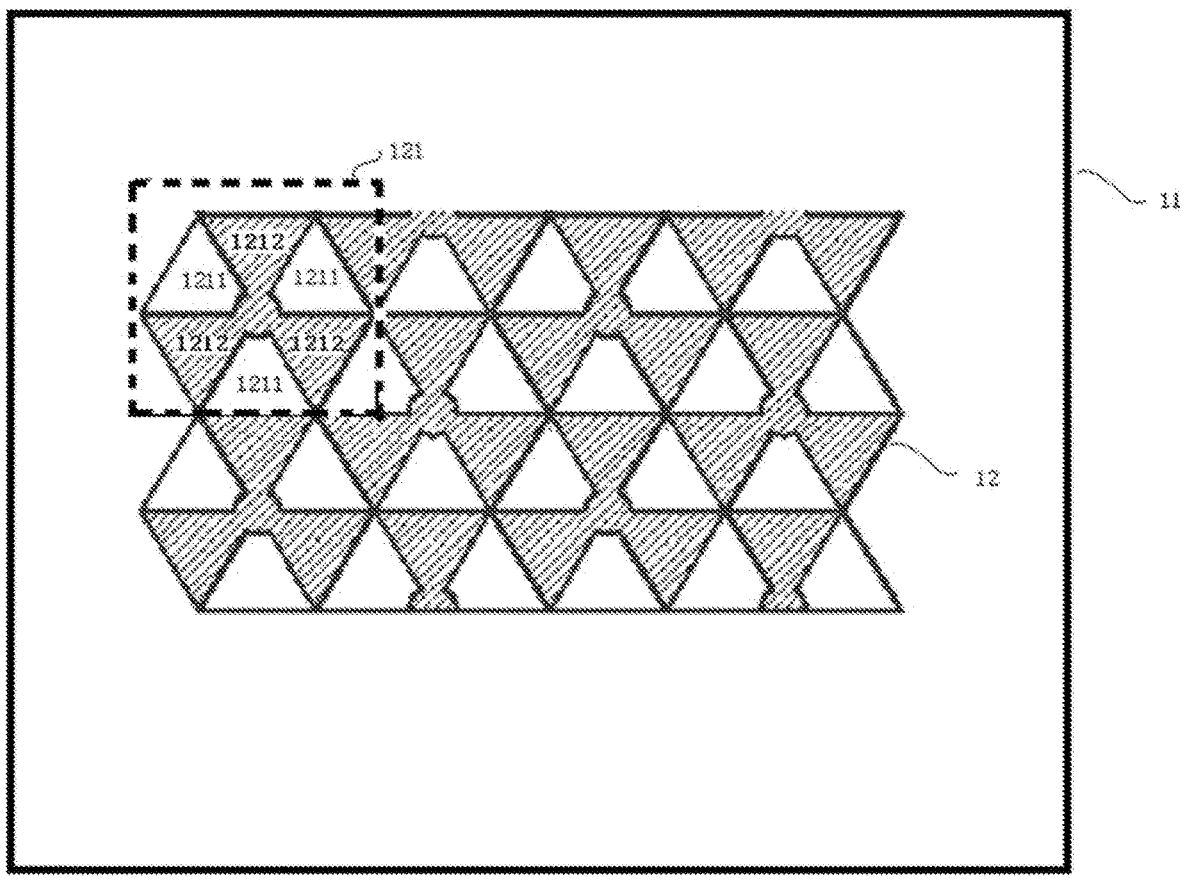
FIG. 1 is a structural schematic diagram of a display substrate according to an embodiment of the present disclosure.

Embodiments of the present disclosure are described in detail below, examples of which are illustrated in the drawings, in which the same or similar reference numbers indicate the same or similar elements or elements having the same or similar functions throughout. The embodiments described below with reference to the drawings are exemplary and are intended to explain the present disclosure, and should not be construed as limiting the present disclosure.

Hereinafter, a display substrate, a display panel and a display device according to embodiments of the present disclosure will be described with reference to the drawings.

How to improve the display screen is of great significance in improving the accuracy of embedded fingerprint identification.

FIG. 1 is a structural schematic diagram of a display substrate according to an embodiment of the present disclosure.

As shown in FIG. 1, the display substrate 10 may include: a substrate 11, and a plurality of polygonal pixels 121 arranged in an array on the substrate 11. Each polygonal pixel 121 includes a plurality of sub-pixels 1211 and a photoelectric sensor 1212. An orthographic projection of the plurality of sub-pixels 1211 on the substrate 11 and an orthogonal projection of the photoelectric sensor 1212 on the substrate 11 do not overlap with each other.

As shown in FIG. 1, the plurality of polygonal pixels 121 form an array 12 for performing display and/or fingerprint detection.

In some embodiments, in each polygonal pixel 121, the plurality of sub-pixels 1211 are disposed on the periphery of the polygonal pixel 121, and an edge of each sub-pixel 1211 at a periphery of the polygonal pixels 121 overlaps with an edge of the polygonal pixel 121.

Figure 2:
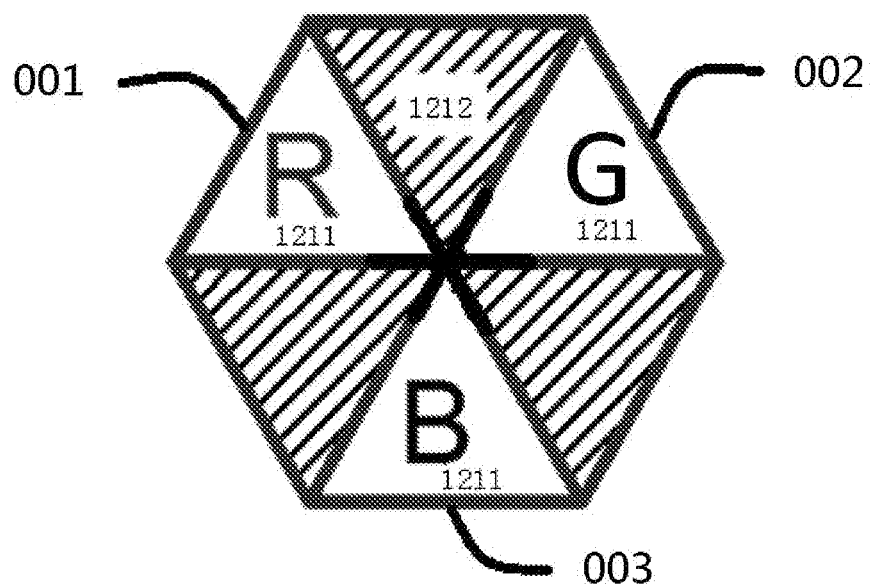
FIG. 2 is a structural schematic diagram of a polygonal pixel according to an embodiment of the present disclosure.
Figure 3:
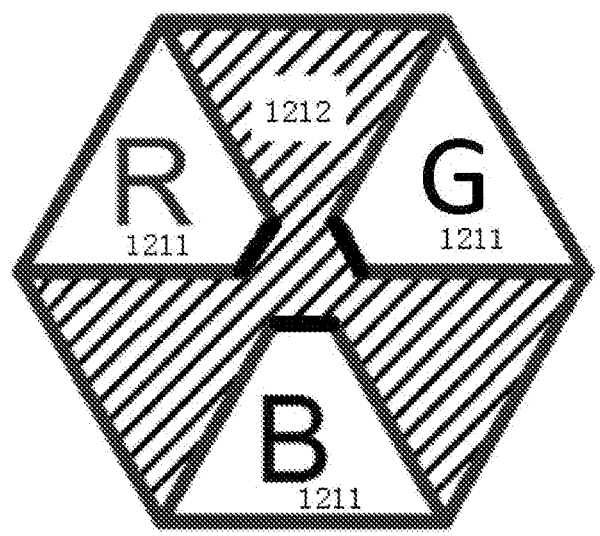
FIG. 3 is a structural schematic diagram of a polygonal pixel according to another embodiment of the present disclosure.

In some embodiments, as shown in FIG. 2 and FIG. 3, a shape of the sub-pixel 1211 is a triangle or an isosceles trapezoid.

Figure 4:
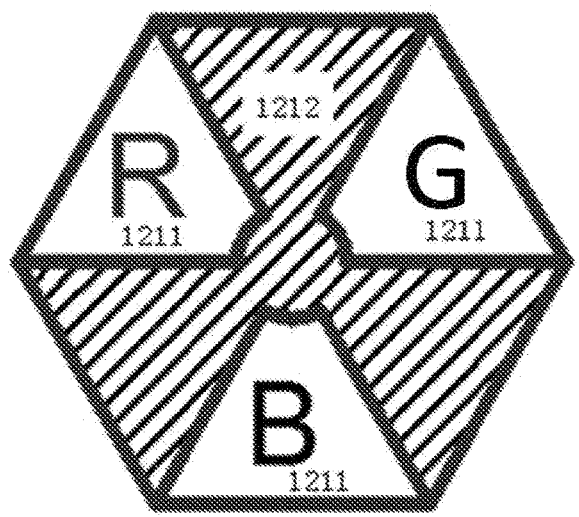
FIG. 4 is a structural schematic diagram of a polygonal pixel according to yet another embodiment of the present disclosure.

In some embodiments, as shown in FIG. 4, in each polygonal pixel 121, an edge of each sub-pixel 1211 near the center of the polygonal pixel 121 has an arc shape, and an arcing direction of the arc shape departs from the center of the polygonal pixel 121.

In some embodiments, each polygonal pixel 121 includes three sub-pixels 1211 of different colors (e.g. RGB), and a shape of the polygonal pixel 121 is a hexagon.

As shown in FIG. 2, the three sub-pixels 1211 of different colors in each polygonal pixel 121 correspond to the first edge 001, the third edge 002, and the fifth edge 003 of the hexagon respectively.

Figure 6:
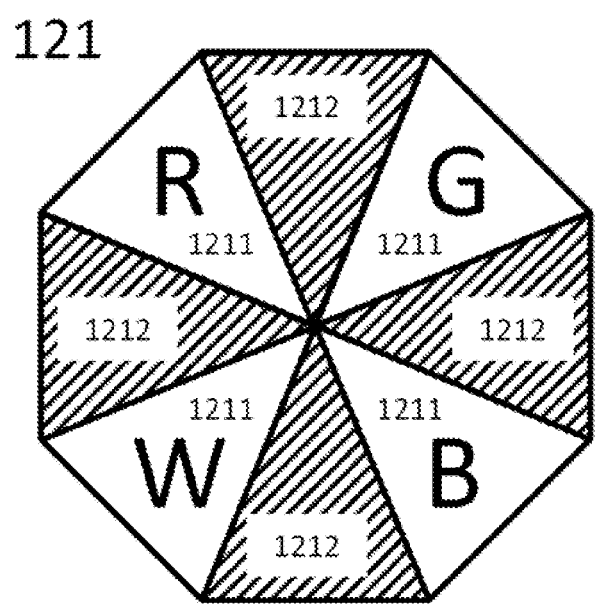
FIG. 6 is a structural schematic diagram of a polygonal pixel according to still another embodiment of the present disclosure.

In some embodiments, as shown in FIG. 6, each polygonal pixel 121 includes four sub-pixels 1211 of different colors (e.g. RGBW), and a shape of the polygonal pixels 121 is an octagon.

In some embodiments, as shown in FIG. 6, the four sub-pixels 1211 of different colors in each polygonal pixel 121 correspond to the first edge, the third edge, the fifth edge and the seventh edge of the octagon respectively.

The polygonal pixel 121 with a hexagonal shape will be described as an example below.

In an embodiment of the present disclosure, the sub-pixel 1211 may have a triangular shape. The polygonal pixel 121 composed of such sub-pixels 1211 is shown in FIG. 2. The red sub-pixel corresponds to the edge 001 at the upper left corner of the hexagon, the green sub-pixel corresponds to the edge 002 at the upper right corner of the hexagon, and the blue sub-pixel corresponds to the edge 003 at the bottom of the hexagon. In this case, the photoelectric sensor 1212 includes three regions which are unconnected with each other (i.e., three isolated regions). For example, each region may correspond to one photoelectric sensor 1212, resulting in higher resolution. It should be understood that the arrangement of the sub-pixels is not limited to the manner shown in FIG. 2. For example, the red sub-pixel may correspond to the edge at the top of the hexagon, the green sub-pixel may correspond to the edge at lower left corner of the hexagon, and the blue sub-pixel may correspond to the lower right corner of the hexagon. FIG. 2 is just one of many arrangements.

In another embodiment of the present disclosure, the sub-pixel 1211 may have an isosceles trapezoid shape. The polygonal pixels 121 composed of such sub-pixels 1211 is shown in FIG. 3. In this case, the three regions corresponding to the photoelectric sensor 1212 connect with each other. That is, one polygonal pixel 121 corresponds to one photoelectric sensor 1212.

In some embodiments, as shown in FIG. 4, in each polygonal pixel 121, an edge of each sub-pixel 1211 near the center of the polygonal pixel 121 has an arc shape, and an arcing direction of the arc shape departs from the center of the polygonal pixel 121. The polygonal pixels 121 composed of such sub-pixels 1211 can be as shown in FIG. 4. In this case, the three regions corresponding to the photoelectric sensor 1212 connect with each other. That is, one polygonal pixel 121 corresponds to one photoelectric sensor 1212.

Figure 5:
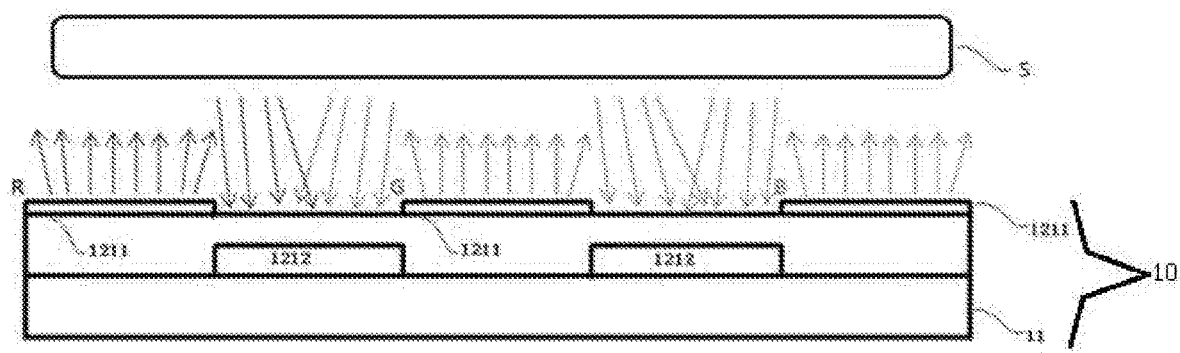
FIG. 5 is a schematic diagram of a light reflection effect according to an embodiment of the present disclosure.

In addition, in order to prevent the light emitted by the sub-pixel 1211 from affecting the photoelectric sensor 1212, in an embodiment of the present disclosure, the photoelectric sensor 1212 and the plurality of sub-pixels 1211 are disposed in different layers, and the plurality of sub-pixels 1211 are closer to the light exit side (i.e. the side on which the reflector 5 is located in FIG. 5) of the display substrate 10 than the photoelectric sensor 1212. As shown in FIG. 5, the light emitted by the sub-pixel 1211 is reflected by the reflector 5, and the reflected light is received by the photoelectric sensor 1212. Since the photoelectric sensor 1212 is lower than the sub-pixel 1211, the photoelectric sensor 1212 does not directly receive the light emitted by the sub-pixel 1211, so that the light emitted by the sub-pixel 1211 does not affect the photoelectric sensor 1212.

In some embodiments, the photoelectric sensor 1212 is a photodiode. Those skilled in the art can understand that the photoelectric sensor can also be a photomultiplier tube, a photoresistor, a phototransistor, a photocell, a semiconductor color sensor, a pyroelectric sensor, an optoelectronic coupler, and the like.

In some embodiments, as shown in FIG. 5, the sub-pixel 1211 is a light emitting device. For example, the sub-pixel 1211 may be an OLED. Those skilled in the art can understand that the sub-pixel 1211 may also be a transparent device (e.g. a liquid crystal cell or a filter). As shown in FIG. 5, in this case, light from below the substrate 11 can pass through the sub-pixel 1211 and be reflected by the reflector 5 to the photoelectric sensor 1212. The sub-pixel 1211 can be a filter, and the display substrate 10 can thus be a color film substrate in a liquid crystal display device.

In the display substrate according to the embodiment of the present disclosure, a plurality of sub-pixels and photoelectric sensor are arranged in a polygonal pixel, and a plurality of polygonal pixels form an array, which can maximize the collection of light signals, thereby improving the efficiency of the photoelectric sensor and the accuracy of fingerprint identification.

The present disclosure also provides a display panel including the display substrate described in the above embodiments.

The present disclosure further provides a display device including the display panel described in the above embodiment. The display device may be a display screen of a mobile terminal, a tablet computer, or the like. Based on the display device, an embedded fingerprint identification method can be implemented. Specifically, when the display device is displaying, the display device emits light. The user can press a finger on the display device, and the display device can receive the light reflected by the user's finger. After receiving the reflected light, the photodiode in the display device can send the light intensity information to the processor, and the processor generates a fingerprint image. Then the fingerprint image is compared with the fingerprint template pre-recorded in the fingerprint library to identify the fingerprint. With this display device, the accuracy of embedded fingerprint identification can be effectively improved.

In the description of the present specification, the description referring to the terms "an embodiment", "some embodiments", "an example", "a specific example", or "some examples" or the like means specific characters, structures, materials, or features described in conjunction with the embodiment or example are included in at least one embodiment or example of the present disclosure. In this specification, the schematic representation of the above terms does not necessarily have to refer to the same embodiment or example. Furthermore, the specific characters, structures, materials, or features described may be combined in any suitable manner in any one or more of the embodiments or examples. In addition, those skilled in the art can combine the different embodiments or examples described in this specification and features of different embodiments or examples without conflicting with each other.

Furthermore, the terms "first" and "second" are used for descriptive purposes only, and are not to be construed as indicating or implying relative importance or implicitly indicating the number of indicated technical features. Thus, features defined with "first", "second" may explicitly or implicitly include at least one such feature. In the description of the present disclosure, the meaning of "plurality" is at least two, such as two, three, etc., unless specifically defined otherwise.

Any process or method described in the flowcharts or described in other manners may be read to mean modules, sections, or portions of code that represent executable instructions that include one or more steps for implementing a custom logic function or process. The scope of the preferred implementations of the present disclosure includes additional implementations in which functions may be performed in an order that is not shown or discussed, including in a substantially simultaneous manner or in reverse order depending on the function involved. It will be understood by those skilled in the art to which the embodiments of the present disclosure pertain.

The logic and/or steps (which for example may be considered as a sequence listing of executable instructions for implementing logical functions) described in the flowchart or described in other manners may be embodied in any computer-readable medium to be used by or in combination with an instruction execution system, apparatus, or device (e.g. a computer-based system, a system including a processor, or other system that can fetch instructions from an instruction execution system, apparatus, or device and execute instructions). For this specification, a "computer-readable medium" can be any means that can contain, store, communicate, propagate, or transport the program to be used by or in combination with the instruction execution system, apparatus, or device. More specific examples (non-exhaustive listings) of a computer-readable medium include electrical connections (electronic devices) with one or more wires, portable computer disk cartridges (magnetic devices), random access memory (RAM), read-only memory (ROM), erasable programmable read-only memory (EPROM or flash memory), optical fiber devices, and portable compact disk read-only memory (CDROM). In addition, the computer-readable medium may even be paper or other suitable medium on which the program can be printed. Paper or other medium can be scanned optically and be processed by editing, interpretation, or other suitable methods if necessary, by this way the program can be obtain electronically and then stored in computer memory.

It should be understood that individual portions of the present disclosure may be implemented in hardware, software, firmware, or a combination thereof. In the above embodiments, a plurality of steps or methods may be implemented using software or firmware stored in a memory and executed by a suitable instruction execution system. For example, if implemented in hardware as in another embodiment, it may be implemented using any one or a combination of the following techniques known in the art: discrete logic circuits with logic gates for implementing logic functions on data signals, dedicated integrated circuits with suitable combinational logic gates, programmable gate arrays (PGA), field programmable gate arrays (FPGA), etc.

Persons of ordinary skill in the art may understand that all or part of the steps carried by the method in the foregoing embodiment may be performed through a program to instruct related hardware. The program may be stored in a computer-readable storage medium that, when executed, includes one or a combination of the steps of the method embodiments.

In addition, each functional unit in each embodiment of the present disclosure may be integrated in one processing module, or each unit may exist alone physically, or two or more units may be integrated in one module. The above integrated module can be implemented in the form of hardware or in the form of a software function module. Integrated modules can also be stored on a computer-readable storage medium if they are implemented in the form of software function modules and sold or used as a stand-alone product.

The above described storage medium may be a read-only memory, a magnetic disk or an optical disk, and the like. Although embodiments of the present disclosure have been shown and described above, it will be understood that the above described embodiments are exemplary and not to be construed as limiting the present disclosure, and that those of ordinary skill in the art may alter, modify, substitute and vary the above embodiments within the scope of the present disclosure.

What is claimed is:

1. A display substrate, comprising:
a substrate; and a plurality of polygonal pixels arranged in an array on the substrate,
wherein each polygonal pixel comprises:
a plurality of sub-pixels; and
a photoelectric sensor having three regions,
wherein an orthographic projection of the plurality of sub-pixels on the substrate and an orthogonal projection of the photoelectric sensor on the substrate do not overlap with each other, and three regions of the photoelectric sensor are connected with each other, and
wherein in each polygonal pixel, an edge of each sub-pixel near a center of the polygonal pixel has an arc shape, and an arcing direction of the arc shape departs from the center of the polygonal pixel.

2. The display substrate according to claim 1, wherein in each polygonal pixel, the plurality of sub-pixels are disposed on a periphery of the polygonal pixel, and an edge of each sub-pixel at a periphery of the polygonal pixel overlaps with an edge of the polygonal pixel.

3. The display substrate according to claim 2, wherein a shape of the sub-pixel is a triangle or an isosceles trapezoid.

4. The display substrate according to claim 1, wherein each polygonal pixel further comprises three sub-pixels of different colors, and a shape of the polygonal pixels is a hexagon.

5. The display substrate according to claim 4, wherein the three sub-pixels of different colors in each polygonal pixel correspond to a first edge, a third edge, and a fifth edge of the hexagon, respectively.

6. The display substrate according to claim 1, wherein each polygonal pixel further comprises four sub-pixels of different colors, and a shape of the polygonal pixels is an octagon.

7. The display substrate according to claim 6, wherein the four sub-pixels of different colors in each polygonal pixel correspond to a first edge, a third edge, a fifth edge, and a seventh edge of the octagon, respectively.

8. The display substrate according to claim 1, wherein the photoelectric sensor and the plurality of sub-pixels are disposed in different layers on the substrate, and the plurality of sub-pixels are closer to a light exit side of the display substrate than is the photoelectric sensor.

9. The display substrate according to claim 1, wherein the photoelectric sensor is a photodiode.

10. The display substrate according to claim 1, wherein the sub-pixel is a light emitting device.

11. A display panel, comprising the display substrate according to claim 1.

12. The display panel according to claim 11, wherein in each polygonal pixel, the plurality of sub-pixels are disposed on a periphery of the polygonal pixel, and an edge of each sub-pixel at a periphery of the polygonal pixel overlaps with an edge of the polygonal pixel.

13. The display panel according to claim 12, wherein a shape of the sub-pixels is a triangle or an isosceles trapezoid.

14. The display panel according to claim 11, wherein each polygonal pixel includes three sub-pixels of different colors, and a shape of the polygonal pixels is a hexagon.

15. The display panel according to claim 14, wherein the three sub-pixels of different colors in each polygonal pixel correspond to a first edge, a third edge, and a fifth edge of the hexagon, respectively.

16. The display panel according to claim 11, wherein each polygonal pixel includes four sub-pixels of different colors, and a shape of the polygonal pixels is an octagon.

17. The display panel according to claim 16, wherein the four sub-pixels of different colors in each polygonal pixel correspond to a first edge, a third edge, a fifth edge, and a seventh edge of the octagon, respectively.

18. A display device, comprising the display panel according to claim 11.

* * * * *